(12) United States Patent
Gao et al.

(10) Patent No.: US 11,008,648 B2
(45) Date of Patent: May 18, 2021

(54) CUO/SE COMPOSITE FILM

(71) Applicant: Shaanxi Normal University, Shaanxi (CN)

(72) Inventors: Fei Gao, Shaanxi (CN); Rongrong Gao, Shaanxi (CN); Hao Liu, Shaanxi (CN); Shengzhong Liu, Shaanxi (CN)

(73) Assignee: Shaanxi Normal University, Xi'an (CN)

(*) Notice: Subject to any disclaimer, the term of this patent is extended or adjusted under 35 U.S.C. 154(b) by 19 days.

(21) Appl. No.: 16/729,343

(22) Filed: Dec. 28, 2019

(65) Prior Publication Data

US 2020/0308691 A1 Oct. 1, 2020

(30) Foreign Application Priority Data

Mar. 28, 2019 (CN) .......................... 201910244517.8

(51) Int. Cl.
| | |
|---|---|
| *H01L 21/02* | (2006.01) |
| *C23C 14/08* | (2006.01) |
| *C23C 14/35* | (2006.01) |
| *C23C 14/18* | (2006.01) |
| *C23C 14/16* | (2006.01) |

(52) U.S. Cl.
CPC ............ *C23C 14/087* (2013.01); *C23C 14/16* (2013.01); *C23C 14/18* (2013.01); *C23C 14/35* (2013.01); *H01L 21/02381* (2013.01); *H01L 21/02403* (2013.01); *H01L 21/02422* (2013.01); *H01L 21/02554* (2013.01); *H01L 21/02598* (2013.01); *H01L 21/02631* (2013.01)

(58) Field of Classification Search
CPC ............... H01L 31/073; H01L 31/1828; H01L 21/02472; H01L 21/02474; H01L 21/02477
See application file for complete search history.

(56) References Cited

U.S. PATENT DOCUMENTS

| | | | |
|---|---|---|---|
| 2009/0147370 A1* | 6/2009 | Parkin | C23C 16/4481 359/634 |
| 2010/0187693 A1* | 7/2010 | Mountsier | H01L 21/76864 257/751 |

* cited by examiner

*Primary Examiner* — Jaehwan Oh

(57) ABSTRACT

Disclosed is a CuO/Se composite film, in which Se with low melting point (221° C.) and strong photosensitivity is introduced into CuO, providing the film with fewer defects and excellent optical, electrical and photoelectric properties. In the preparation method of the invention, Se is introduced into CuO and melted by low-temperature annealing, and then the molten Se can infiltrate CuO to eliminate or reduce defects in the CuO film such as voids and dangling bonds, thereby improving optical, electrical and photoelectric properties of the film and overcoming the shortcomings that CuO has poor crystallinity, high melting point and is decomposed at a high temperature.

11 Claims, 2 Drawing Sheets

US 11,008,648 B2

CUO/SE COMPOSITE FILM

CROSS-REFERENCE TO RELATED APPLICATIONS

This application claims the benefit of priority from Chinese Patent Application No. 201910244517.8, filed on Mar. 28, 2019. The content of the aforementioned application, including any intervening amendments thereto, is incorporated herein by reference in its entirety.

TECHNICAL FIELD

The application relates to semiconductor materials, and more particularly to a semiconductor cupric oxide/selenium (CuO/Se) composite film.

BACKGROUND OF THE INVENTION

Cupric oxide (CuO) is an important p-type semiconductor material, which has an optical band gap of approximately 1.4 eV and low price due to the vast available copper resources. Cupric oxide also has a wide range of applications in the superconducting, magnetic, catalyzing and gas sensing materials, as well as energy-storage and solar cells. Since CuO will be decomposed near its melting point (1026° C.), it can not be prepared by a vacuum thermal evaporation method, and the crystallinity of CuO can not be improved by a high-temperature annealing method. Currently, the methods for preparing a CuO film mainly include magnetron sputtering, electrochemical deposition and chemical solution spin coating. However, the CuO film prepared by these methods has poor crystallinity and many defects, resulting in severe carrier recombination and poor device performance.

SUMMARY OF THE INVENTION

In order to solve the problems in the prior art such as poor crystallinity, the invention provides a cupric oxide/selenium composite film, in which Se with a low melting point (221° C.) and strong photosensitivity is introduced, thereby improving the film in the crystallinity and optical, electrical and photoelectronic properties.

The invention provides a CuO/Se composite film herein, comprising a CuO—Se composite, wherein the CuO—Se composite comprises at least one of $CuSe_2$, CuSe and $Cu_2Se$; and the CuO/Se composite film comprises 10-60 at. % of Cu, 10-60 at. % of O and 10-60 at. % of Se, where O is the same as Cu in atomic percent (at. %).

In some embodiments, the CuO/Se composite film comprises 20-40 at. % of Cu and 20-50 at. % of Se.

In some embodiments, the CuO/Se composite film contains $Cu_2O$, $CuSe_2$, and optionally CuSe and $Cu_2Se$.

In some embodiments, the CuO/Se composite film is further doped with 3-10 at. % of Si, Fe or Ge.

The CuO/Se composite film is prepared by a magnetron sputtering method, comprising:

co-sputtering CuO and Se to deposit a crude CuO/Se composite film on a substrate; and then annealing the crude CuO/Se composite film at 150-300° C. in air or nitrogen for 1-3 min to obtain the CuO/Se composite film;

or depositing a CuO film on a glass substrate using magnetron sputtering; depositing a Se film on the CuO film by thermal evaporation; and then annealing the CuO film and the Se film thereon in air or nitrogen at 150-300° C. for 10-60 min to obtain the CuO/Se composite film.

The CuO/Se composite film may also be prepared using a chemical solution method, comprising:

mixing a CuO powder and a Se powder uniformly in a molar ratio of 1:2-3 by grinding; adding the mixed powder to dimethyl sulfoxide; stirring the reaction mixture at 50-70° C. for 6-10 h; spin-coating the reaction mixture on a substrate; and annealing the substrate at 150-200° C. for 5-10 min to prepare the CuO/Se composite film.

The above substrate is any one of a monocrystalline silicon wafer, an ordinary glass, a quartz glass, an indium tin oxide conductive glass and a fluorine-doped tin oxide conductive glass.

The beneficial effects of the present invention are described as follows.

In the invention, Se with a low melting point (221° C.) and strong photosensitivity is introduced into CuO, and then melt by low-temperature annealing (near the melting point of Se). The molten Se can infiltrate CuO to eliminate or reduce the defects in the CuO film such as voids and dangling bonds, providing the CuO/Se composite film with fewer defects. The composite film combines the merits of CuO such as strong light adsorption and suitable band gap with the merits of Se such as low melting point, low-temperature preparation and treatment and strong photosensitivity, simultaneously overcoming the shortcomings that CuO has high melting point and is decomposed at a high temperature and Se has too large band gap (about 1.8 eV). Thus, the film prepared herein has excellent optical, electrical and photoelectronic properties, having a brilliant application prospect in the fields of optoelectronic devices (including solar cells).

DETAILED DESCRIPTION OF EMBODIMENTS

The present invention will be further described in detail below with reference to the accompanying drawings and embodiments, however, these embodiments are not intended to limit the invention.

Example 1

An ordinary glass substrate was cleaned sequentially in acetone, ethanol and deionized water under ultrasonication for 10 min, dried with nitrogen and then placed in a magnetron sputtering deposition chamber. The deposition chamber was vacuumed to $2\times10^{-4}$ Pa using a mechanical pump and a turbomolecular pump, and a distance between the glass substrate and a target material was adjusted to 6 cm. Then the glass substrate was heated to 200° C. An argon vent valve was opened to fill the deposition chamber with argon. Simultaneously, a mass flow meter was opened to control the argon flow rate to 30 sccm. The pressure of the deposition chamber was adjusted to 0.6 Pa. CuO and Se were co-sputtered onto the rotated substrate under a sputtering power of 60 W for 30 min to deposit a composite film on the glass substrate, where the deposited composite film had a thickness of 4 μm. After that, the deposited composite film was naturally cooled to room temperature and annealed at 200° C. in the air for 1 min to obtain a CuO/Se composite film.

Figure 1:
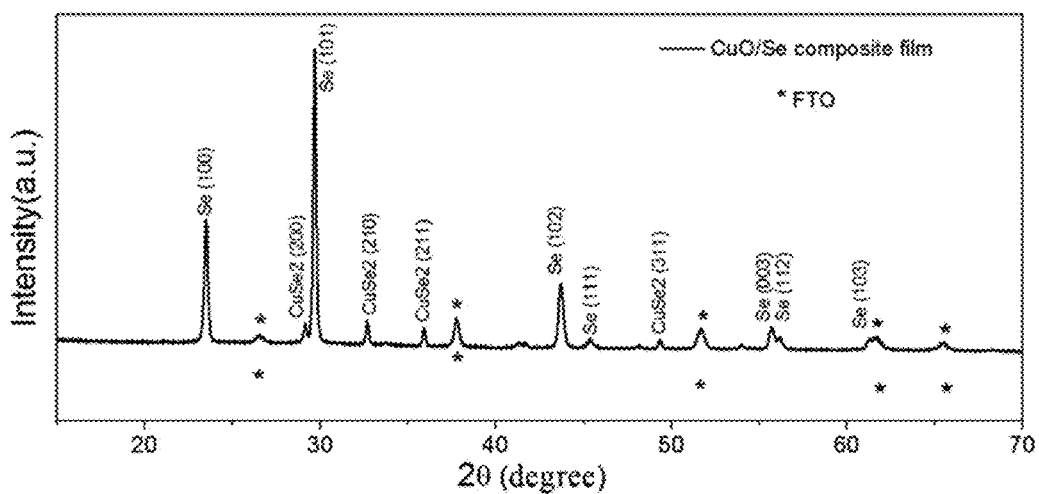
FIG. 1 shows an X-ray diffraction pattern characterizing the structure of a CuO/Se composite film prepared in Example 1.
Figure 2:
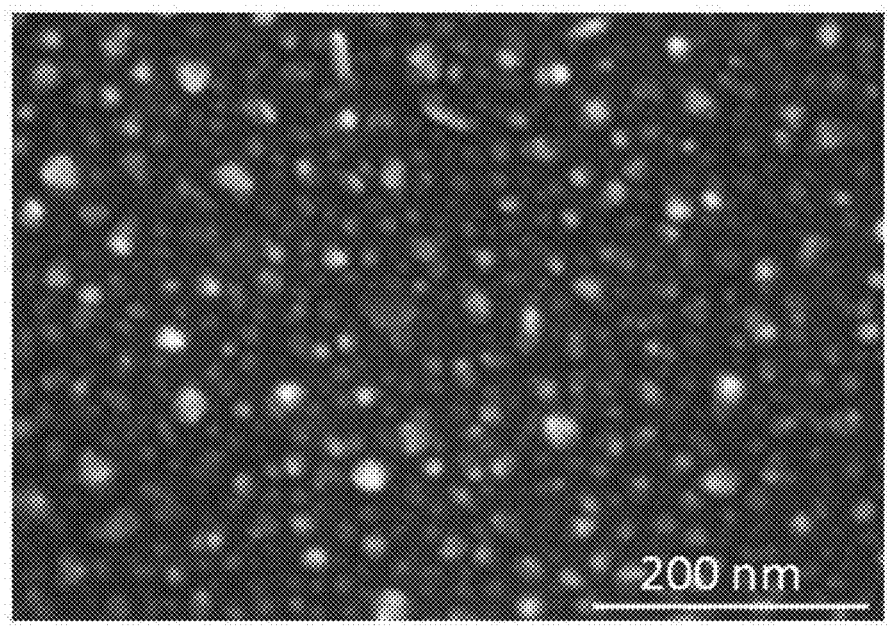
FIG. 2 is a scanning electron micrograph (SEM) showing the CuO/Se composite film prepared in Example 1.
Figure 3:
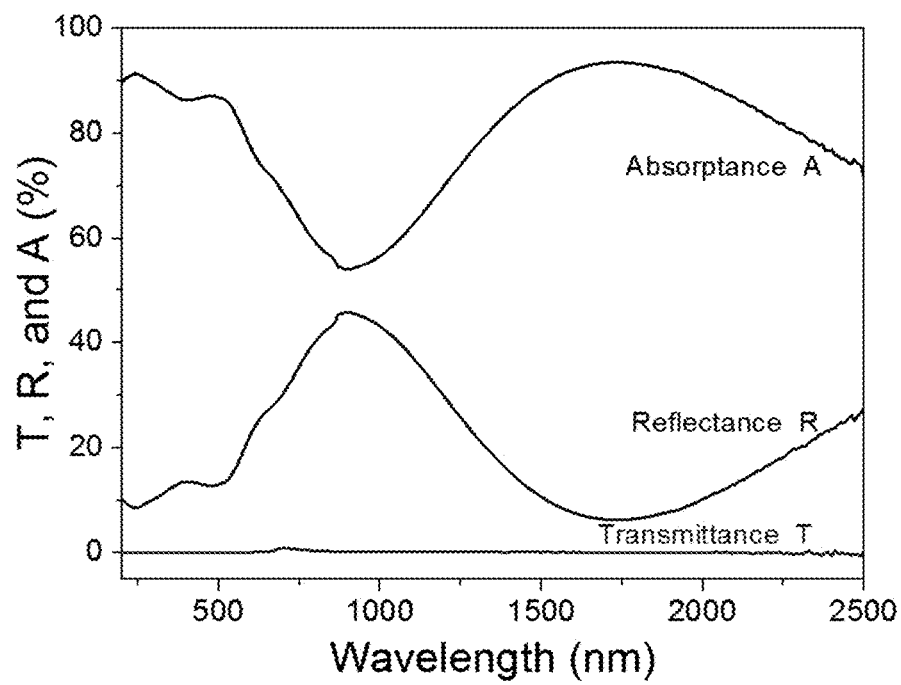
FIG. 3 is an absorption spectrum of the CuO/Se composite film prepared in Example 1.
Figure 4:
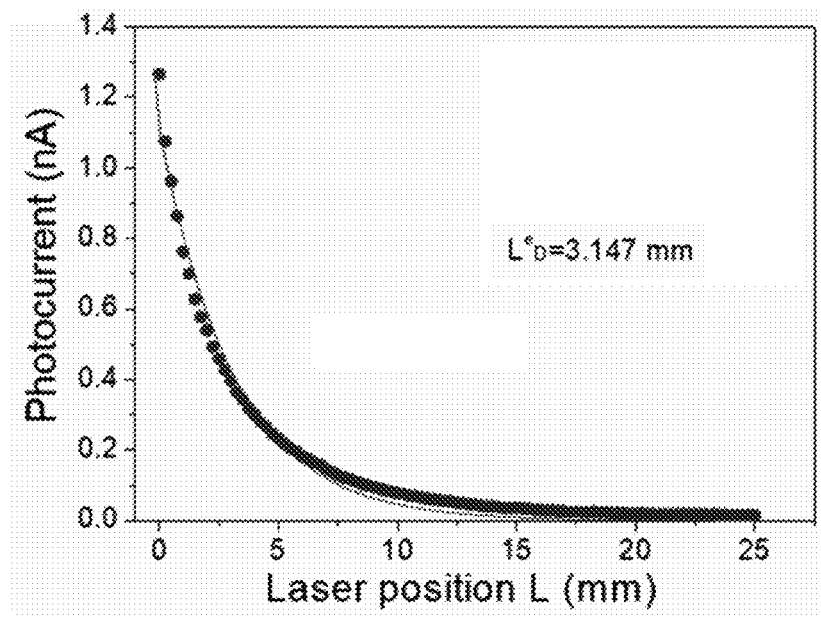
FIG. 4 is a graph showing the photocurrent decay of the CuO/Se composite film prepared in Example 1 with a carrier diffusion distance.

The CuO/Se composite film prepared herein was confirmed by a Hall-effect measurement to have a p-type conductivity, a carrier concentration of $2.05 \times 10^{19}$ cm$^{-3}$, a mobility of 98 cm$^2$V$^{-1}$s$^{-1}$ and a resistivity of $3.12 \times 10^{-3}$ Ωcm. It can be seen from the X-ray diffraction pattern in FIG. 1 that in the CuO/Se composite film, CuO was amorphous and a part of Se was nano-crystalline and estimated to have an average crystalline size of 48 nm through the Debye-Scherrer equation. Moreover, CuSe$_2$ nanocrystals were observed in the film with an average crystalline size of 44 nm, indicating that the film was a composite non-crystal/nanocrystal film. However, neither CuO nor Se was crystallized in the film without annealing. The atomic percentages of Cu, O and Se in the CuO/Se composite film were measured by energy dispersive X-ray spectroscopy (EDX) to be about 30%, 32% and 38%, respectively. FIG. 2 was a scanning electron micrograph (SEM) which showed that a surface of the CuO/Se composite film was formed from particles of 10-30 nm in size. The absorption spectrum of the CuO/Se composite film was measured using an ultraviolet-visible-near-infrared spectrophotometer, and as shown in FIG. 3, the CuO/Se composite film prepared herein showed strong light adsorption (an average absorption rate was close to 80%) throughout the solar spectrum (250-2500 nm). The photocurrent scanning method was used to directly measure the photocurrent decay of the CuO/Se composite film with carrier diffusion distance, and the results were shown in FIG. 4. The photo-generated carrier diffusion length $L_D$ of the CuO/Se composite film was calculated to be 3.147 mm according to the exponential decay equation $I=I_0\exp(-L/L_D)$, which was longer than the carrier diffusion length of the best p-type monocrystalline silicon (1.95 mm), and far longer than the carrier diffusion length of the organic-inorganic hybrid perovskite materials which were currently widely-researched (for example, a single crystal CH$_3$NH$_3$PbI$_3$ had a carrier diffusion length of 0.32 mm and a polycrystalline film had a carrier diffusion length of 0.014 mm). These characteristics indicated that the CuO/Se composite film of the invention was an excellent electro-optical material.

Example 2

In this embodiment, CuO, Se and Si were co-sputtered to prepare a CuO/Se composite film according to the conditions of Example 1, where the atomic percentages of Cu, O, Se and Si in the CuO/Se composite film were 30%, 30%, 36% and 4%, respectively. The CuO/Se composite film prepared herein also showed strong absorption to light throughout the solar spectrum (250-2500 nm) with an average absorption rate close to 80%. The photo-generated carrier diffusion length $L_D$ of the CuO/Se composite film was directly measured by photocurrent scanning method to be 3.124 mm.

Example 3

A CuO film was deposited by magnetron sputtering on a glass substrate according to the conditions of Example 1, and then a Se film was deposited on the CuO film by conventional thermal evaporation. Then the two layers of films were annealed at 220° C. in the air for 10 min to produce a CuO/Se composite film.

Example 4

0.4 g (5 mmol) of CuO powder and 0.34 g (10 mmol) of Se powder were ground and uniformly mixed, added to 3 mL of DMSO and stirred at 60° C. for 8 h. The reaction mixture was spin-coated on a glass substrate at 1000 rpm. Then the substrate was annealed at 150° C. for 10 min to prepare a CuO/Se composite film.

What is claimed is:

1. A CuO/Se composite film, comprising a CuO—Se composite;
   wherein the CuO—Se composite comprises at least one of CuSe$_2$, CuSe and Cu$_2$Se; and
   the CuO/Se composite film comprises 10-60 at. % of Cu, 10-60 at. % of O and 10-60 at. % of Se, where O is the same as Cu in atomic percent (at. %).

2. The CuO/Se composite film of claim 1, wherein the CuO/Se composite film comprises 20-40 at. % of Cu and 20-50 at. % of Se.

3. The CuO/Se composite film of claim 1, wherein the CuO/Se composite film contains Cu$_2$O, CuSe$_2$, and optionally CuSe and Cu$_2$Se.

4. The CuO/Se composite film of claim 1, wherein the CuO/Se composite film is further doped with Si, Fe or Ge.

5. The CuO/Se composite film of claim 2, wherein the CuO/Se composite film is further doped with Si, Fe or Ge.

6. The CuO/Se composite film of claim 3, wherein Si, Fe or Ge doped in the CuO/Se composite film is 3-10 at. %.

7. The CuO/Se composite film of claim 4, wherein Si, Fe or Ge doped in the CuO/Se composite film is 3-10 at. %.

8. The CuO/Se composite film of claim 1, wherein the film is prepared by a magnetron sputtering method comprising:
   depositing a crude CuO/Se composite film on a substrate by co-sputtering of CuO and Se; and then annealing the crude CuO/Se composite film at 150-300° C. in air or nitrogen for 1-3 min to produce the CuO/Se composite film;
   or depositing a CuO film on a glass substrate using magnetron sputtering; depositing a Se film on the CuO film by thermal evaporation; and then annealing the CuO film and the Se film deposited thereon in air or nitrogen at 150-300° C. for 10-60 min to produce the CuO/Se composite film.

9. The CuO/Se composite film of claim 1, wherein the film is prepared by a chemical solution method comprising:
   mixing a CuO powder and a Se powder uniformly in a molar ratio of 1:2-3 by grinding; adding the mixed powder to dimethyl sulfoxide; stirring the reaction mixture at 50-70° C. for 6-10 h; spin-coating the reaction mixture on a substrate; and annealing the substrate at 150-200° C. for 5-10 min to prepare the CuO/Se composite film.

10. The CuO/Se composite film of claim 7, wherein the substrate is any one of a monocrystalline silicon wafer, an ordinary glass, a quartz glass, an indium tin oxide conductive glass and a fluorine-doped tin oxide conductive glass.

11. The CuO/Se composite film of claim 8, wherein the substrate is any one of a monocrystalline silicon wafer, an ordinary glass, a quartz glass, an indium tin oxide conductive glass and a fluorine-doped tin oxide conductive glass.

* * * * *